United States Patent
Kawakami et al.

(10) Patent No.: US 6,418,123 B1
(45) Date of Patent: Jul. 9, 2002

(54) DESIGNING TOOL FOR DESIGNING ACCESS COMMUNICATION NETWORK, DESIGNING METHOD THEREOF, AND RECORD MEDIUM

(75) Inventors: Hiroyuki Kawakami; Hiroyuki Okazaki, both of Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/213,933

(22) Filed: Dec. 17, 1998

(30) Foreign Application Priority Data

Dec. 17, 1997 (JP) .............................. 9-348283

(51) Int. Cl.[7] .............................................. H04L 12/28
(52) U.S. Cl. ..................... 370/254; 370/252; 370/351; 703/1; 703/13
(58) Field of Search ................................ 370/252, 254, 370/255, 351, 257, 411, 546; 703/13, 21, 22, 26; 708/100, 200; 709/220, 223

(56) References Cited

U.S. PATENT DOCUMENTS

| 5,329,464 | A | * | 7/1994 | Sumic et al. ................ 364/512 |
| 5,508,999 | A | * | 4/1996 | Cox, Jr. et al. ................ 370/17 |
| 5,561,790 | A | * | 10/1996 | Fusaro ........................ 395/500 |
| 6,058,262 | A | * | 5/2000 | Kawas et al. ........... 395/500.34 |
| 6,185,193 | B1 | * | 2/2001 | Kawakami et al. ......... 370/254 |
| 6,199,032 | B1 | * | 3/2001 | Anderson ..................... 703/21 |

FOREIGN PATENT DOCUMENTS

| EP | 0 614 151 | 9/1994 |
| JP | 4-316167 | 11/1992 |
| JP | 5-290023 | 11/1993 |
| JP | 8-249362 | 9/1996 |
| JP | 9-91328 | 4/1997 |
| JP | 3050174 | 3/2000 |

OTHER PUBLICATIONS

Kawakami et al.; "A Design Support System for Access Networks by Using Existing Resources"; The Institute of Electronics, Information and Communication Engineers; 1997; 2 Sheets.

Kawakami et al.; "ATM Network Design Support System—FTTC/FTTB Access Network Design Module"; The Institute of Electronics, Information and Communication Engineers; 1 Sheet.

* cited by examiner

Primary Examiner—Ricky Ngo
Assistant Examiner—Tri Phan
(74) Attorney, Agent, or Firm—Foley & Lardner

(57) ABSTRACT

The present invention is a designing method for designing an access communication network with a computer, the method including the steps of (a) reading a design file and inputting an existing facility information and a various parameter information, (b) designating and/or canceling a fixed mode to and from the existing facility information, (c) editing and inputting a temporarily fixed mode to an additional facility that has not been designed the fixed mode, (d) assigning a demand to facilities that have been designated the fixed mode or the temporarily fixed mode and calculating the structure of the access communication network and the positions of facilities thereof at low deployment costs that satisfy limited conditions of the various parameter information that has been input at the step (a), and (e) storing the structure of the calculated access communication network and the positions of facilities thereof to the design file.

12 Claims, 9 Drawing Sheets

F I G.5
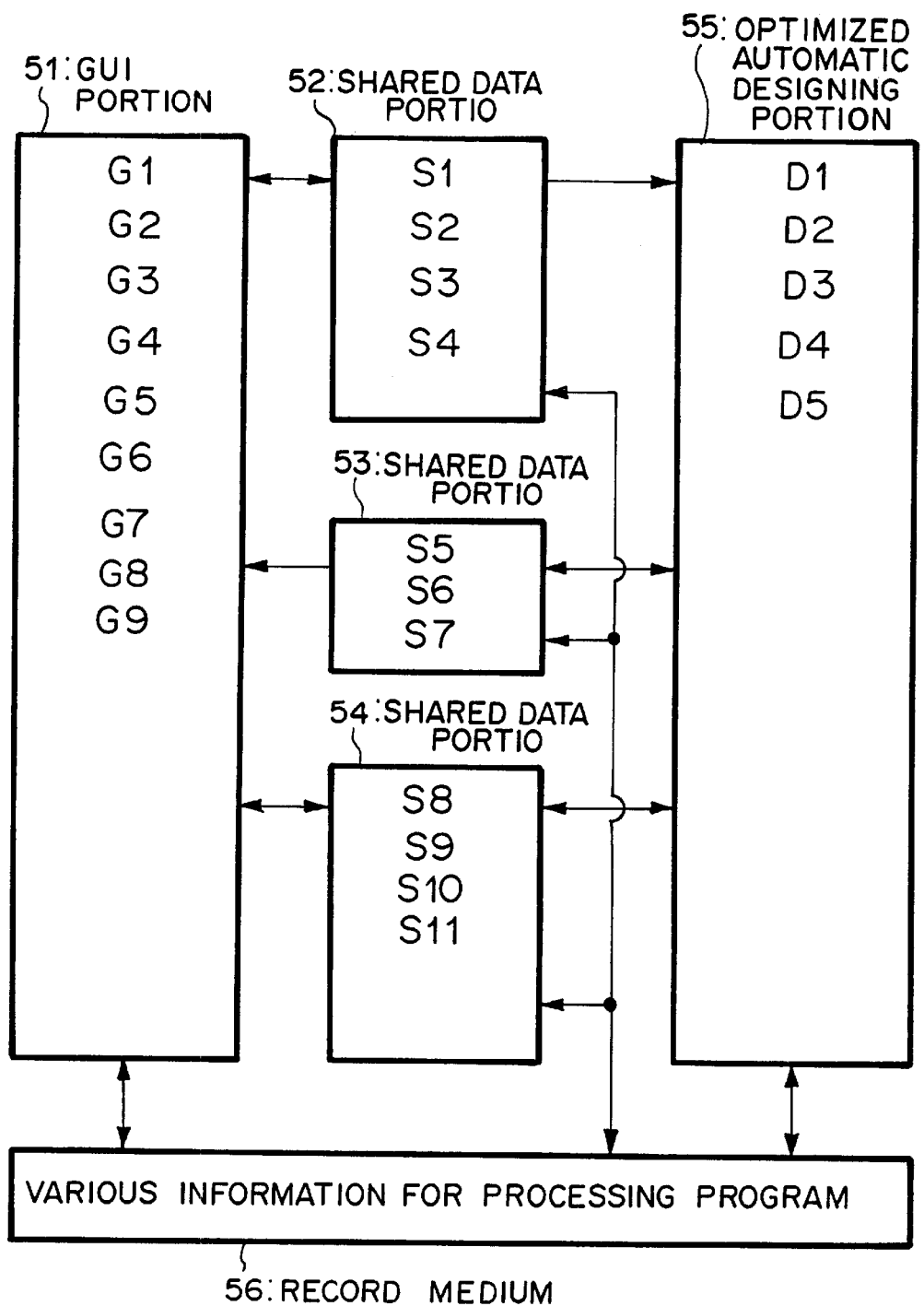

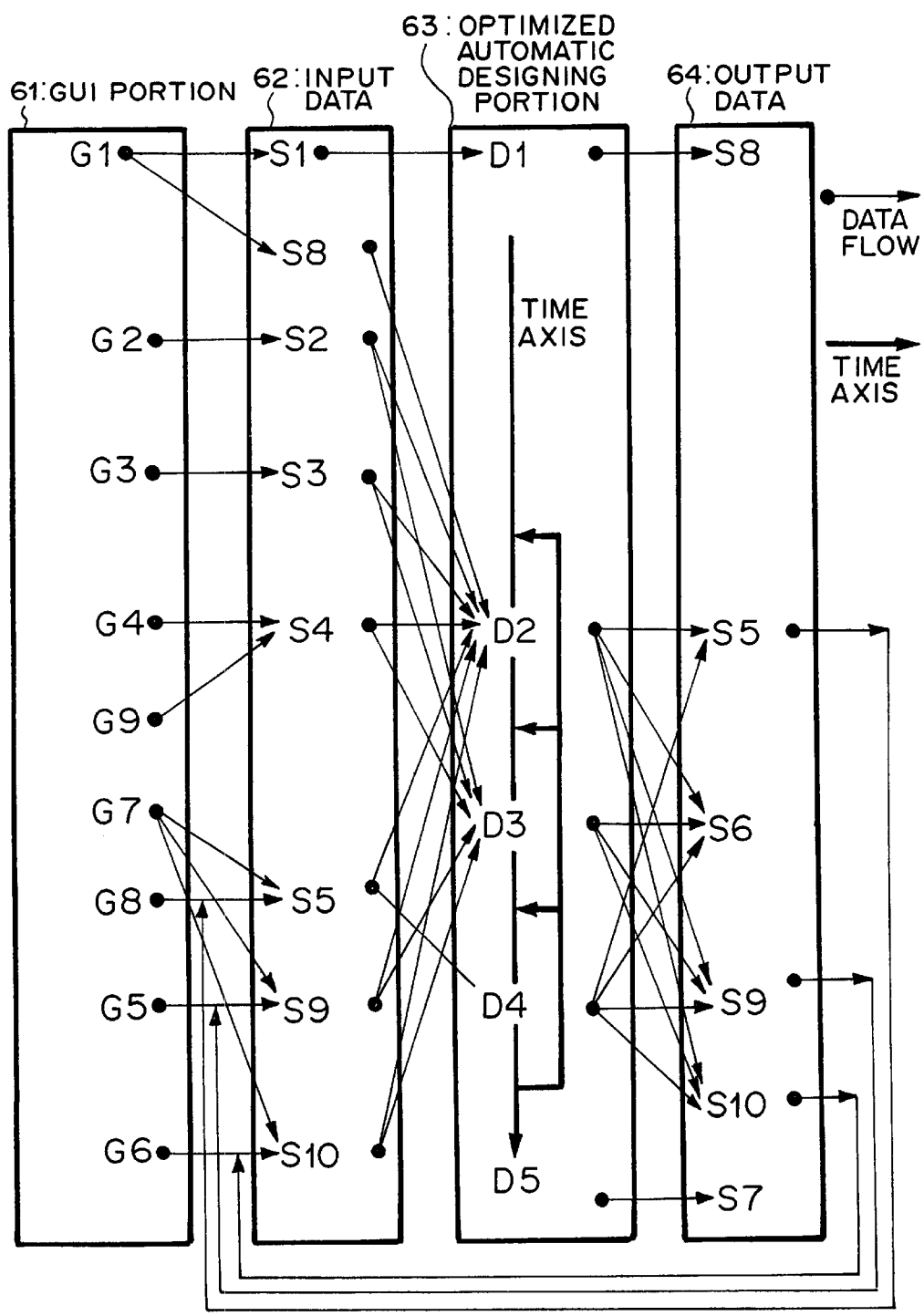

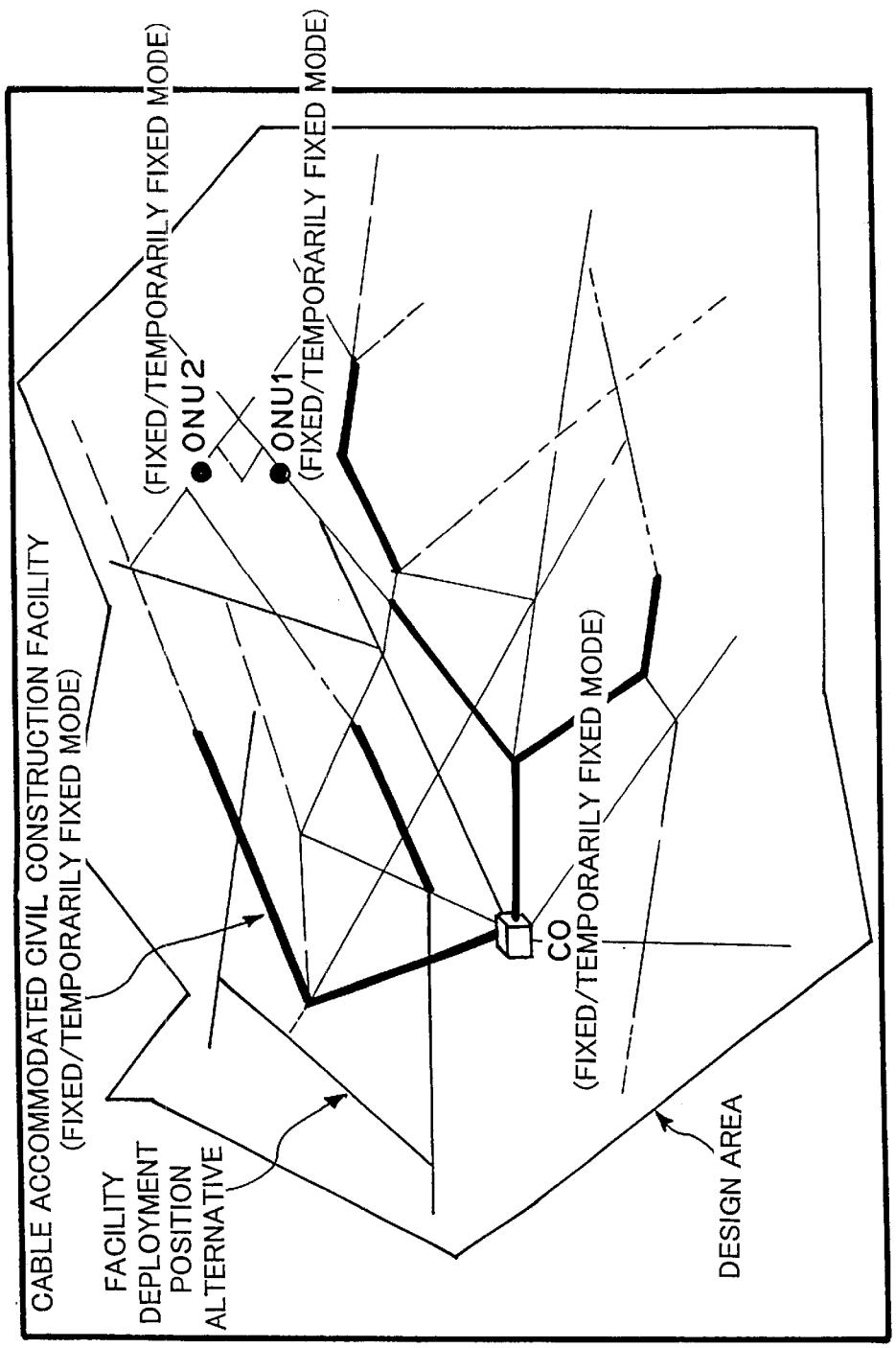

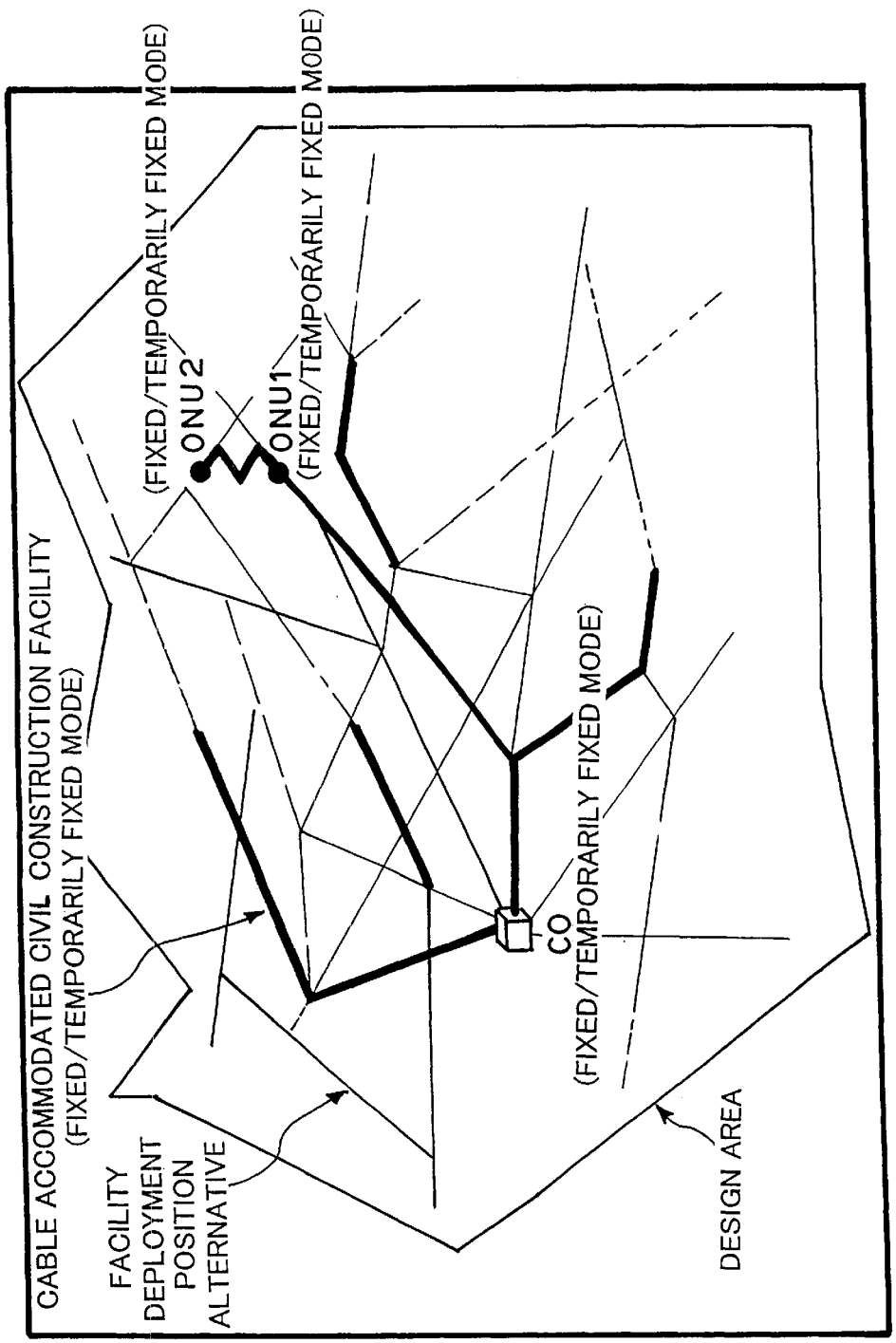

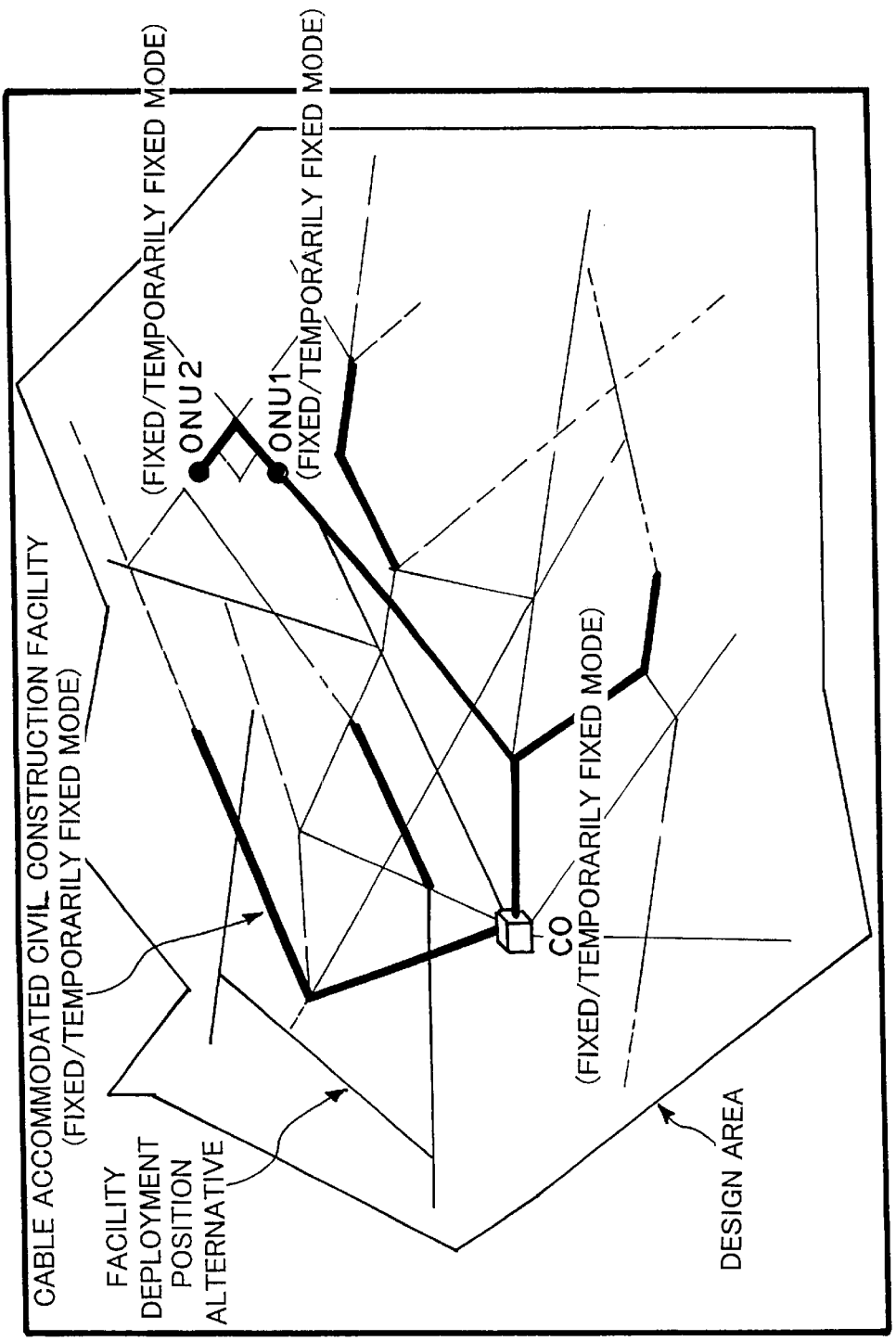

DESIGNING TOOL FOR DESIGNING ACCESS COMMUNICATION NETWORK, DESIGNING METHOD THEREOF, AND RECORD MEDIUM

BACKGROUND OF THE INVENTION

1. Field of the Invention

The present invention relates to a computer assisted access communication network designing system, a designing tool thereof, and a record medium from which a computer reads a program that causes the computer to accomplish the access communication network designing system. In particular, the present invention relates to a computer assisted access communication network system that calculates an access communication network structure and necessary civil construction facilities that are accomplished at low deployment costs and that satisfy a demand considering geographical shape, facility deployment position alternative, subscription demand, and existing facilities with limited conditions of communication quality, deployed positions of communication facilities, and so forth and relates to a designing tool thereof and a record medium from which a computer reads a program that causes the computer to accomplish the access communication network system.

2. Description of the Related Art

In recent years, computer assisted access communication network designing tools (systems) for LAN, mobile systems, backbone (high speed, long distance communication line) systems, CATV systems, and so forth have been placed particularly in the global market. In particular, mobile system designing tools with an automatic designing function (that allows a communication network structure to be automatically calculated corresponding to input data, geographic information, and so forth) have been increasingly used. On the other hand, designing work is computerized with CAD/CAM and the like. Thus, it is desired to use and improve a computer assisted access communication network designing system for designing a public telephone network, performing a recovery operation of an emergency public telephone line, and designing a local area network such as LAN or WAN.

As such prior art references, (1) Japanese Patent Laid-Open Publication No. Hei-4-316167, (2) paper by Hiroyuki Kawakami, 1996 Society Convention, "The Institute of Electronics, Information and Communication Engineers," Japan, B-792, and (3) paper by Hiroyuki Kawakami, 1997 Society Convention, The Institute of Electronics, Information and Communication Engineers, Japan, SB-8-9 have been disclosed.

In a conventional access communication network designing system, facilities are not clearly categorized as communication facilities and civil construction facilities thereof. Thus, when an access communication network is automatically designed with such a system, the designer cannot edit and define existing facilities.

In reality, when an access communication network is designed, its structure and deployment of facilities thereof should be calculated corresponding to geographical information, subscription demand information, facility information, and design parameter information with limited conditions such as communication quality assuming that the existing facilities are not present so that the deployment cost is reduced.

However, under such limited conditions, when a broad band access communication network is designed, existing communication facilities and civil construction facilities of a conventional narrow band access communication network cannot be re-used. In addition, the designer cannot freely define facility deployment position alternatives. Before the system automatically designs an access communication network, the designer cannot designate facility deployment positions. Moreover, the system cannot automatically design an additional network using a blank capacity with the existing facilities. Thus, the designer cannot limit the facility deployment positions and reduce the cost using the existing facilities with the system.

SUMMARY OF THE INVENTION

To solve such problems, the inventors of the present invention have filed a non-opened art reference as Japanese Patent Application No. 09-195100. This art reference is a designing system for designing an access communication network structure and deployment positions of facilities thereof at low deployment costs corresponding to design parameter information including geographic information, subscription demand information, facility information, and initial accommodation ratio in a design area, the designing system comprising a facility defining means for defining position information and facility information for communication facilities such as communication units, cables, and management/test systems and civil construction facilities such as ducts and overhead cable facilities; a facility deployment position alternative defining means for defining deployment position alternatives for communication/civil construction facilities; and an automatic designing means for prohibiting existing facilities from being moved or deleted corresponding to input/edited data or automatically calculated facility information and for automatically calculating an access communication network structure and necessary civil construction facilities at low deployment costs in an appending format and free from an influence of the accommodated lines.

The filed art reference allows the accuracy of the calculated results of a low cost access communication network structure to be improved and an exceptional deployment position to be designated. Thus, when the designer designates one type of appending design mode to each facility, the system performs a first appending designing function that does not affect existing facilities, a second appending designing function based on designed results, and a third appending designing function performed in many years.

In the designing method of the filed art reference, an access communication network structure can be calculated at low facility deployment cost at a time in an appending format corresponding to communication/civil construction facility information (such as geographic information, subscription demand information, and capacitance in a design area), existing communication/civil construction facility information, and facility deployment position alternative information.

However, the above-described art reference has the following problems.

As a first problem, even if a route at the minimum cost is obtained considering the binding of cables, the route contains many bends. Thus, such a route may not be suitable from views of management and maintenance. In other words, it is difficult for the designer to input the number of bends of the route before the system automatically designs a relevant access communication network. Even if the designer inputs the number of bends, since the number of spaces to be solved increases, the system takes a long time to calculate an access communication network at low deployment cost with given limited conditions.

As a second problem, when the designer edits/inputs a facility at a desired position and designates "fixed mode" to the newly input facility as an existing facility, the cost of the newly input facility is not included in the total cost. Thus, the designer cannot know the cost of the newly input facility.

As a third problem, since the system designs an access communication network structure assuming that the land costs in the design area are the same, the accuracy of the designed results in an area whose land cost is dominant deteriorates.

An object of the present invention is to provide a designing method for designing an access communication network corresponding to limited conditions such as bends of a deigned route considering low deployment cost and low land costs. Another object of the present invention is a record medium from which a computer reads a program that causes the computer to perform the access communication network designing method.

To solve the above-described problems, the present invention is a system for calculating an optimum access communication network structure in an appending format considering geographic shape, facility deployment position alternatives, subscription demand, existing facilities, and so forth with a computer. In the system, along with "fixed mode" for protecting existing facilities, "temporarily fixed mode" can be designated to each facility so as to reflect information that is difficult to clearly define (for example "a route of a cable is preferably free from bends" and "a management area (equivalent to a cluster) is preferably simply structured") to final results.

A facility designated the "temporarily fixed mode" can be edited. However, the automatic designing portion assigns a blank capacity to a facility designated the "temporarily fixed mode" as a cost-free facility with high priority like an existing facility designated the "fixed mode". In the final total cost calculating process, the automatic designing portion appends a facility designated the "temporarily fixed mode" as an appended facility.

The "temporarily fixed mode" is used when the designer pre-assigns the position of a facility before the system automatically designs an access communication network. Alternatively, the "temporarily fixed mode" is used when the designer references data that has been automatically designed, designates a communication network structure corresponding to limited conditions, and causes the system to automatically design the access communication network.

Since the designer repeatedly inputs data and the system repeatedly calculates an access communication network corresponding to the data that is input by the designer, an access communication network can be accomplished at low deployment cost considering information that is difficult to clearly define as limited conditions before the system designs the access communication network.

Another feature of the present invention is in that facility deployment position alternative data has land cost information per unit area at each intersection so as to improve the calculated accuracy of an access communication network at low deployment cost.

A first aspect of the present invention is a designing method for designing an access communication network with a computer that automatically calculates the structure of the access communication network and deployment positions of facilities thereof at low deployment costs corresponding to design parameter information including geographical information, subscription demand information, facility information, and initial accommodation ratio in a design area, the method comprising the steps of reading a design file and inputting the existing facility information and the various parameter information, designating or canceling a fixed mode to or from the existing facility information, editing and inputting a temporarily fixed mode to an additional facility that has not been designed the fixed mode, assigning a demand to facilities that have been designated the fixed mode or the temporarily fixed mode and calculating the structure of the access communication network and the positions of facilities thereof at low deployment costs that satisfy limited conditions of the various parameter information that has been input at the inputting step, and storing the structure of the calculated access communication network and the positions of facilities thereof to the design file.

At the inputting step, the existing facility information and the various parameter information are input from a mode designating/canceling portion that designates "temporarily fixed mode" or "fixed mode" to an attribute of each facility and each cluster or designates another mode thereto, a cluster defining portion that allows a cluster of a trunk station and a terminal station to be newly input and an existing cluster to be edited, and a land cost defining portion that allows a land cost per unit area to be input for each intersection.

A second aspect of the present invention is a designing method for designing an access communication network with a computer that automatically calculates the structure of the access communication network and deployment positions of facilities thereof at low deployment costs corresponding to design parameter information including geographical information, subscription demand information, facility information, and initial accommodation ratio in a design area, the method comprising the steps of reading a design file and inputting the existing facility information and the various parameter information, designating or canceling a fixed mode to or from the existing facility information, editing and inputting a temporarily fixed mode to an additional facility that has not been designed the fixed mode, assigning a demand to facilities that have been designated the fixed mode or the temporarily fixed mode and calculating the structure of the access communication network and the positions of facilities thereof at low deployment costs that satisfy limited conditions of the various parameter information that has been input at the inputting step, adding the cost of each facility that has been designated the temporarily fixed mode to the total cost of the existing facilities, and storing the structure of the access communication network and the positions of facilities thereof obtained at the calculating step and the costs of the facilities calculated at the cost calculating step to the design file.

A third aspect of the present invention is a designing tool for designing an access communication network with a computer that automatically calculates the structure of the access communication network and deployment positions of facilities thereof at low deployment costs corresponding to design parameter information including geographical information, subscription demand information, facility information, and initial accommodation ratio in a design area, the method comprising an inputting means for reading a design file and inputting the existing facility information and the various parameter information, a designating/canceling means for designating or canceling a fixed mode to or from the existing facility information, an editing/inputting means for editing and inputting a temporarily fixed mode to an additional facility that has not been designed the fixed mode, a calculating means for assigning a demand to facilities that have been designated the fixed mode or the temporarily fixed mode and calculating the structure of the access communication network and the positions of facilities thereof at low deployment costs that satisfy limited conditions of the various parameter information that has been input by the inputting means, and a storing means for storing the structure of the calculated access communication network and the positions of facilities thereof to the design file.

A forth aspect of the present invention is a record medium from which a computer reads a program that causes the computer to execute a designing method for designing an access communication network with the computer that automatically calculates the structure of the access communication network and deployment positions of facilities thereof at low deployment costs corresponding to design parameter information including geographical information, subscription demand information, facility information, and initial accommodation ratio in a design area, the method comprising the steps of reading a design file and inputting the existing facility information and the various parameter information, designating or canceling a fixed mode to or from the existing facility information, editing and inputting a temporarily fixed mode to an additional facility that has not been designed the fixed mode, assigning a demand to facilities that have been designated the fixed mode or the temporarily fixed mode and calculating the structure of the access communication network and the positions of facilities thereof at low deployment costs that satisfy limited conditions of the various parameter information that has been input at the inputting step, and storing the structure of the calculated access communication network and the positions of facilities thereof to the design file.

Next, with reference to a flow chart shown in FIG. 2, an outline of the designing method according to the present invention will be described. At step S21, the system reads a design file. The design file may include all information that is input/output in the designing process. At step S22, the designer adds information that is insufficient in the design file or modifies information in the design file. At step S23, when required, the designer inputs/edits existing facility information and designates/cancels the "fixed mode" to/from each facility so as to protect the existing facilities. At step S24, the designer inputs/edits a desired non-existing facility to a desired position in the "temporarily fixed mode". At step S25, the system assigns a demand to facilities assuming that facilities designated the "fixed mode" and the "temporarily fixed mode" are cost-free and calculates an optimum (minimum code) communication network structure that satisfies the input limited conditions. At step S26, the designer compares the designed results with limited conditions that are difficult to clearly define. When the designer cannot satisfy the calculated results, the flow returns to step S24. Corresponding to the designed results and the limited conditions that are difficult to clearly define, the designer edits facilities and designates the "temporarily fixed mode" to the edited facilities. At step S25, the system activates the automatic designating portion. After interactively and repeating the designing operation, the flow advances to step S26. When the designer satisfies the designed results, he or she saves the design file and completes the designing operation.

Thus, designed results that are effectively affected with limited conditions that are difficult to clearly define in advance can be obtained by the automatic designing portion with the conventional algorithm.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 5 is a schematic diagram showing the structure of a database for designing the access communication network according to the embodiment of the present invention;

FIG. 6 is a schematic diagram showing the operation of the database for designing the access communication network according to the embodiment of the present invention;

FIG. 7 is a schematic diagram for explaining an example of an designed access communication network according to the embodiment of the present invention;

FIG. 8 is a schematic diagram for explaining an example of a designed access communication network according to the embodiment of the present invention; and FIG. 9 is a schematic diagram for explaining an example of a designed access communication network according to the embodiment of the present invention.

DESCRIPTION OF PREFERRED EMBODIMENTS

Figure 1:
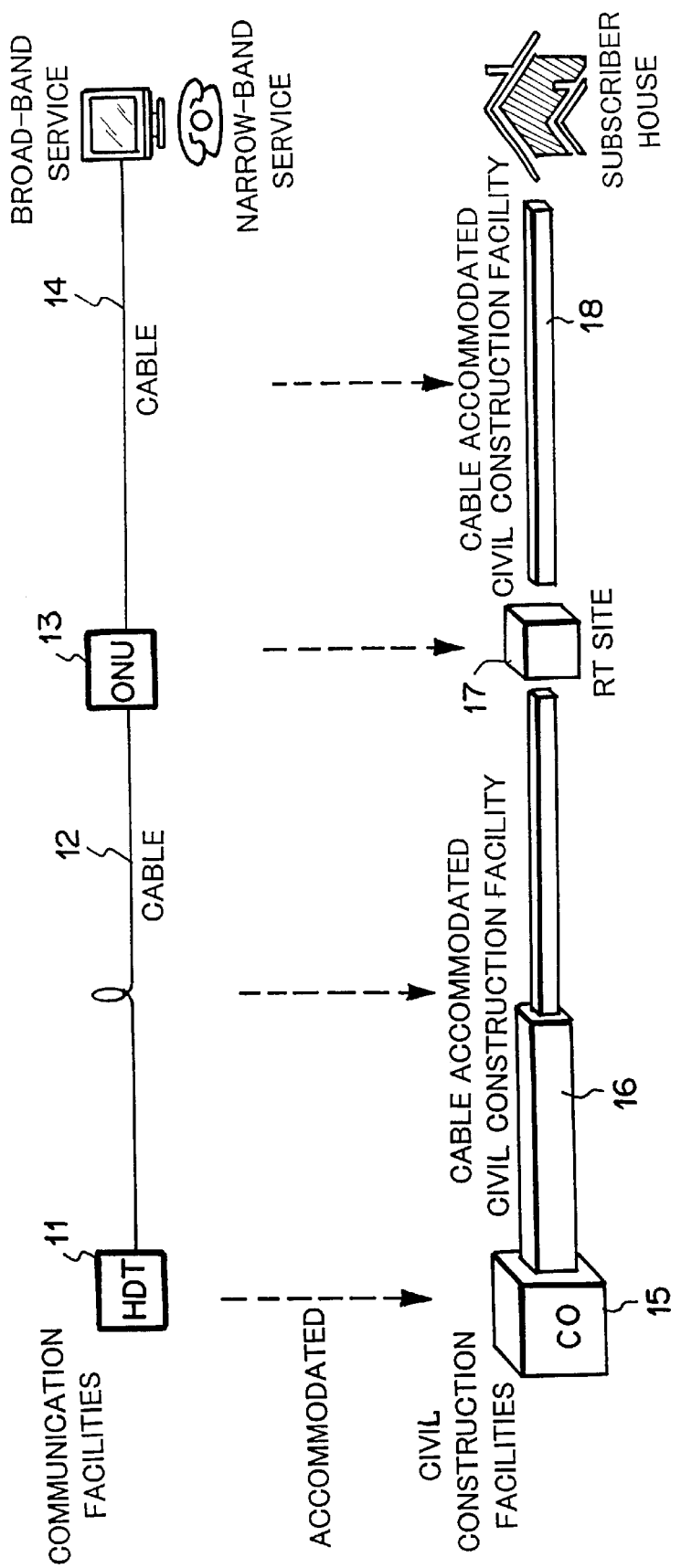
FIG. 1 is a schematic diagram showing the structure of a conceptual environmental system for designing an access communication network according to an embodiment of the present invention.

Next, with reference to the accompanying drawings, embodiments of the present invention will be described. FIG. 1 is a schematic diagram for explaining a facility defining system according to an embodiment of the present invention.

Referring to FIG. 1, when facilities that compose a communication network are designed with a computer, the facilities are categorized as communication facilities and civil construction facilities. The civil construction facilities accommodate the communication facilities. The communication facilities are a HDT (Host Digital Terminal) 11, an ONU (Optical Network Unit) 13, a cable 12, and a cable 14. The HDT 11 is accommodated in a CO (Central Office). The ONU 13 is accommodated in an RT (Remote Terminal) site in a building or a curb. The cable 12 connects the HDT 11 and the ONU 13. The cable 14 connects the ONU 13 and a subscriber house terminal.

On the other hand, the civil construction facilities are a CO 15, a cable accommodated civil construction facility 16, an RT site 17, and a cable accommodated civil construction facility 18. The cable accommodated civil construction facility 16 is for example a duct.

All facilities are designated the "fixed mode" and the "temporarily fixed mode". The "fixed mode" allows communication facilities and civil construction facilities to be automatically designed in an appending format without affecting the existing facilities. The "temporarily fixed mode" allows the designer to deploy a non-existing facility with high priority or deploy a facility with reference to a facility structure calculated by the automatic designing portion with limited conditions that are ambiguous and are difficult to clearly define.

The automatic designing portion does not include a facility designated the "fixed mode" in the total cost. On the other hand, the automatic designing portion includes a facility designated the "temporarily fixed mode" in the total cost.

The automatic designing portion assigns a blank capacitance to facilities that are at low deployment costs with high priority regardless of which the facilities are designated the "fixed model" or the "temporarily fixed mode".

Figure 2:
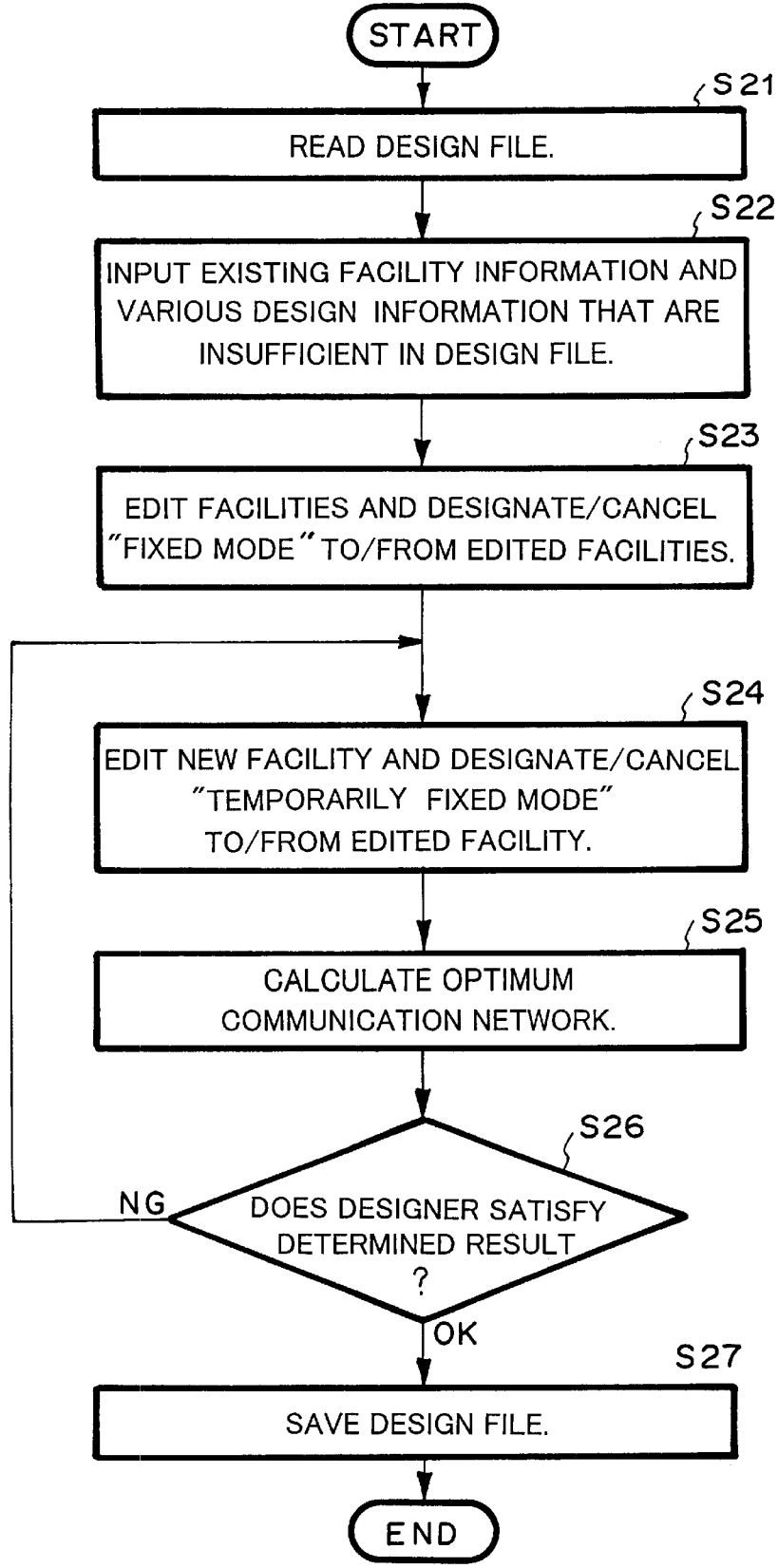
FIG. 2 is a flow chart showing a basic operation of the embodiment of the present invention.

FIG. 2 is a flow chart showing a designing process corresponding to the present invention. At step S21, the system reads a design file. The design file may include all information that is input/output in the designing process.

At step S22, the designer adds information that is insufficient in the design file or modifies information in the design file. Examples of which the information is added are in that subscription demand information represents a database rather than the use of a telephone of a particular subscriber and in that a base station of a portable telephone system is added. Examples of which the information is modified are in that a safety coefficient for protecting congestion is changed and in that a time deviation after a design file is created until a design process is performed is corrected.

At step S23, when required, the designer inputs/edits existing facility information and designates/cancels the "fixed mode" to/from each facility so as to protect the existing facilities. At step S24, the designer inputs/edits a desired non-existing facility to a desired position in the "temporarily fixed mode".

At step S25, the system assigns a demand to facilities assuming that facilities designated the "fixed mode" and the "temporarily fixed mode" are cost-free and calculates an optimum (minimum code) communication network structure that satisfies the input limited conditions. At step S26, the designer compares the designed results with limited conditions that are difficult to clearly define. When the designer cannot satisfy the calculated results, the flow returns to step S24. Corresponding to the designed results and the limited conditions that are difficult to clearly define, the designer edits facilities and designates the "temporarily fixed mode" to the edited facilities. At step S25, the system activates the automatic designating portion. When the designer edits facilities, he or she selects them one after the other or a block of the facilities with a rubber band or the like. The automatic calculating portion calculates the final cost of facilities including those designated the "temporarily fixed mode" as cost-free facilities.

After interactively and repeating the designing operation, the flow advances to step S26. When the designer satisfies the designed results, he or she saves the design file and completes the designing operation.

Thus, designed results that are effectively affected with limited conditions that are difficult to clearly define in advance can be obtained by the automatic designing portion with the conventional algorithm.

Figure 3:
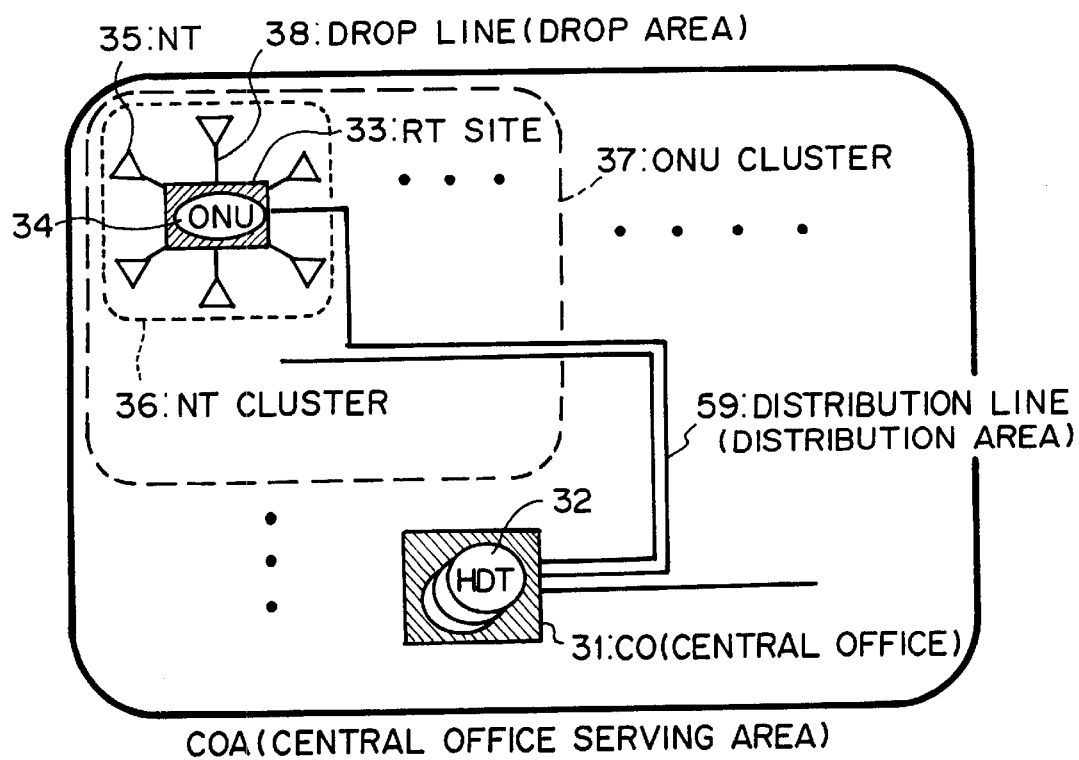
FIG. 3 is a schematic diagram showing the structure of the conceptual environmental system for designing the access communication network according to the embodiment of the present invention.

FIG. 3 is a schematic diagram showing a network to be designed corresponding to an embodiment of the present invention. A COA (Central Office Serving Area) to be designed has FTTC (Fiber To The Curb)/FTTB (Fiber To The Building) type active double-star shaped access network composed of a HDT (Host Digital Terminal) 32, an ONU (Optical Network Unit) 34, and an NT (Network Terminal) 35. The HDT 32 is accommodated in the CO 31. The ONU 34 is accommodated in an outdoor RT (Remote terminal) site 33. The NT 35 is accommodated in a subscriber house.

In a drop area, a plurality of adjacent NTs 35 are bound as an NT cluster 36 and accommodated in the ONU 34 of the same RT site 33. In a distribution area, a plurality of adjacent ONUs 34 are bound as an ONU cluster 37 and accommodated in the same HDT 32.

Figure 4:
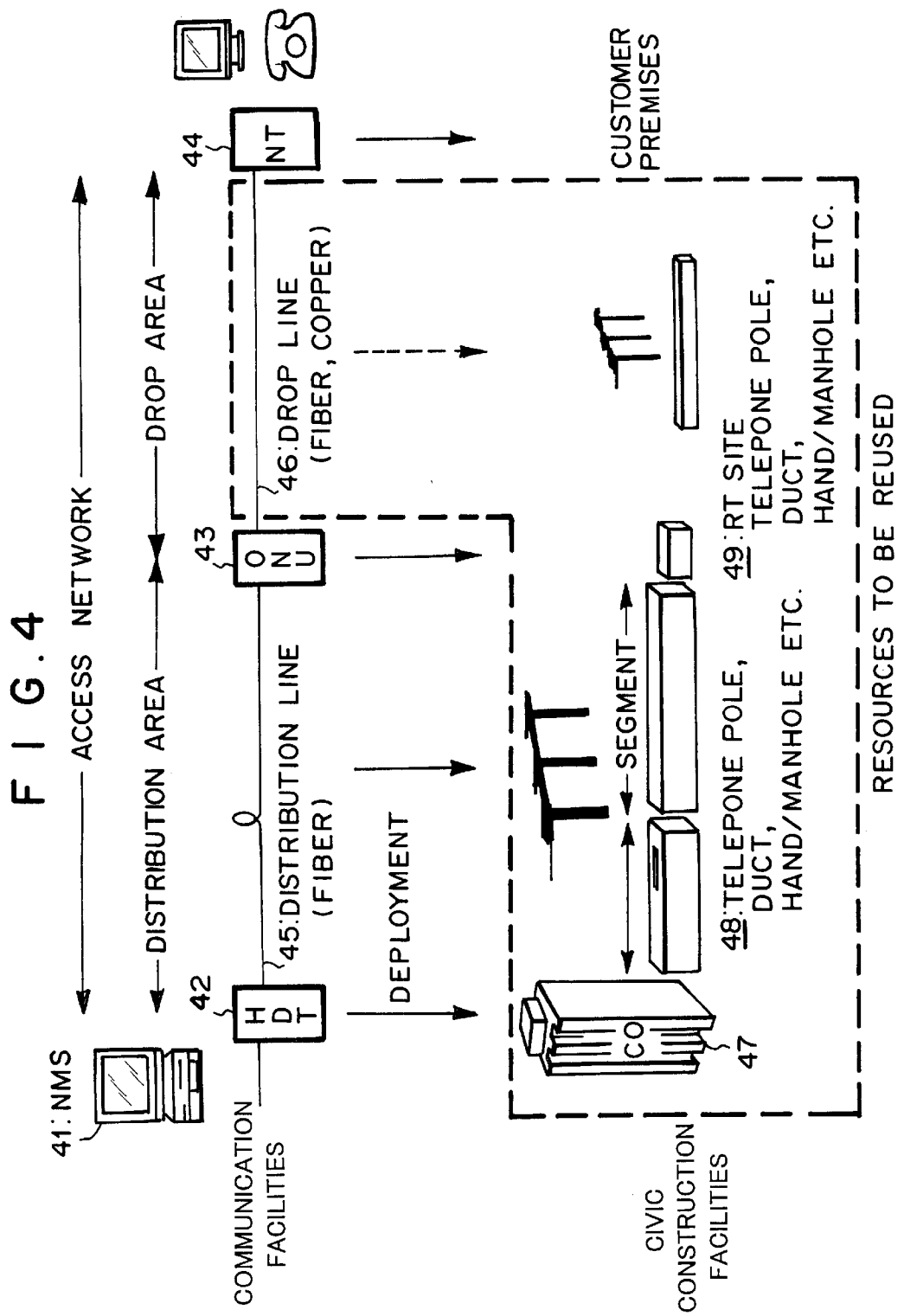
FIG. 4 is a block diagram showing the structure of the conceptual environmental system for designing the access communication network according to the embodiment of the present invention.

Facilities that compose an access network can be categorized as communication facilities and civil construction facilities as shown in FIG. 4. In this example, the communication facilities are composed of an NMS (Network Management System) 41, a HDT 42, a distribution line 45, an ONU 43, a drop line 46, and an NT 44. On the other hand, the civil construction facilities are composed of a telephone pole, an underground civil construction facility (such as a duct 48), an overhead cable facility 48, and other civil construction facilities (for accommodating units of a CO 47 and an RT site 49).

Facilities are deployed considering geographically limited conditions such as a road and a river. The communication facilities are accommodated in the civil construction facilities. In reality, the HDT 42 is accommodated in the CO 47. The ONU 43 is accommodated in the outdoor/indoor RT site 49. Cables and so forth are accommodated in the underground/overhead civil construction facilities through lead-out points.

The automatic designing portion calculates an access communication network at low cost corresponding to the limited conditions and information edited by a deployment position alternative defining portion.

(Structure of Software System)

FIG. 5 is a schematic diagram showing the structure of the system according to an embodiment of the present invention. The system comprises a GUI (Graphical User Interface) portion 51, shared data portions 52, 53, and 54, and an optimized automatic designing portion 55.

The GUI portion 51 has:

G1: subscription demand defining portion that defines the subscription demand;

G2: various design parameter defining portion that defines various parameters such as initial accommodation ratio and unit price of each facility;

G3: facility parameter defining portion that defines scale and characteristic of each facility;

G4: deployment position alternative defining portion that defines deployment alternatives of facilities;

G5: communication facility data defining portion that inputs new communication facilities and edits existing facilities;

G6: civil construction facility data defining portion that inputs new civil construction facilities and edits existing facilities;

G7: mode designating/canceling portion that designates "temporarily fixed mode", "fixed mode", or another mode to an attribute of each facility and an attribute of each cluster;

G8: cluster defining portion that inputs a new ONU/NT cluster and edits existing clusters; and G9: land cost defining portion that inputs a land cost per unit area at each intersection for each deployment alternative.

The shared data portions 52, 53, and 54 are categorized as three types with respect to reading/writing right by the GUI portion 51 and the optimized automatic designing portion 55.

The shared data portion 52 is readable/writable by the GUI portion 51 and is only readable by the optimized automatic designing portion 55. The shared data portion 52 has:

S1: demand information composed of subscription demand, call type information, and so forth;

S2: various design parameters (including costs);

S3: facility definition parameters; and

S4: facility deployment position alternative data composed of facility deployment position alternative information and land cost information per unit area.

The shared data portion 53 is only readable by the GUI portion 51 and is readable/writable by the optimized automatic designing portion 55. The shard data portion 53 has:

S5: cluster data composed of NT cluster information that is NT group information accommodated in the same ONU and ONU cluster information that is ONU group information accommodated in the same HDT;

S6: cost data calculated for each COA by the optimized automatic designing portion 55; and S7: traffic data calculated for each COA.

The shared data portion 54 is readable/writable by both the GUI portion 51 and the optimized automatic designing portion 55.

The shared data portion 54 has:

S8: demand matrix

S9: communication facility data having information of temporarily fixed mode/fixed mode as an attribute;

S10: civil construction facility data having information of temporarily fixed mode/fixed mode as an attribute; and S11: ONU/NT cluster data having information of temporarily fixed mode/fixed mode as an attribute.

All data items of the shared data portion 54 can be defined by the GUI portion 51. The optimized automatic designing portion 55 reads the data defined by the GUI 51 and updates the data corresponding to the information of the shared data portion 52. At this point, values of the communication/civil construction facilities and clusters designated "fixed mode" are not added to total traffic data and total cost data of the shared data portion 53. On the other hand, values of communication/civil construction facilities and clusters designated "temporarily fixed mode" are added to total traffic data and total cost data of the shared data portion 53.

The optimized automatic designing portion 55 has:

D1: demand matrix generating portion that calculates a demand matrix as basic data for all optimized designs corresponding to values defined by the subscription demand defining portion G1;

D2: NT clustering and cost calculating process for generating the cluster data S5 (only an NT cluster) corresponding to the shared data portion 52 and the shared data portion 54;

D3: accommodated route searching and cost calculating process for calculating the optimized cable route between an HDT and an ONU corresponding to the shared data portion 52 and the shared data portion 54;

D4: ONU clustering and cost calculating process for generating the cluster data S5 (only an ONU cluster) corresponding to the shared data portion 52 and the shared data portion 54; and D5: traffic summation processing portion for summing the traffic data S7 for each COA used for designing a backbone communication network corresponding to the shared data portion 52 and the shared data portion 54.

An automatic designing software program and application software program recorded on the record medium 56 cause the computer to exchange data with the GUI portion 51, the shared data portions 52, 53, and 54, and the optimized automatic designing portion 55 so as to compensate the operation of the computer. In addition, the record medium 56 backs up program data.

(Description of Operation of Embodiment)

FIG. 6 is a schematic diagram showing a data flow for explaining the operation of the system according to an embodiment of the present invention. Marks in the FIG. 6 coincide with the marks in the FIG. 5, for example, G1 to G9, S1 to S10 and D1 to D5.

The designer inputs each item of input data 62 through a relevant module of the GUI portion 61. When the input data 62 is used in a communication network management system, communication facility data and cluster data can be directly imported as files. When each item of the input data 62 is input as data for an existing facility, the mode designating/canceling portion G7 designates the "fixed mode" to the cluster data S5, the communication facility data S9, and the civil construction facility data S10.

Each module of the optimized automatic designing portion 63 is executed in the direction of an arrow mark that represents the time axis. When each module of the optimized automatic designing portion 63 is executed, a relevant item of input data 62 denoted by an arrow mark is required. After each module has been executed, a relevant item of output data 64 denoted by an arrow mark is obtained. Each item of the output data 64 is fed back to the input data 62 so as to properly reflect limited conditions and requirements of the designer to the designed results. The algorithm of the optimized automatic designing portion for the "fixed mode" is basically the same as that for the "temporarily fixed mode" except in the cost summing process at the final stage.

The cluster data S5, the communication facility data S9, and the civil construction facility data S10 of the output data 64 that is obtained from the optimized automatic designing portion 63 are designated "temporarily fixed mode" by the mode designating/canceling portion G7 of the GUI portion 61 so as to affect limited conditions that are difficult to define to the final designed results. The cluster data S5, the communication facility data S9, and the civil construction facility data S10 of the input data 62 are modified and input to the optimized automatic designing portion 63. Thus, the optimized automatic designing portion 63 automatically re-designs the access network system with the input data. With such an interactive and repeating designing operation, the designer can obtain the final results with the limited conditions.

The designing method according to the present invention can be applied to a power network and a water supply/drainage system as well as an access communication network. In the case of the power network, the power amount corresponds to the subscription demand and the traffic of the access communication network. The communication facilities correspond to power facilities (not including civil construction facilities). Facility deployment position alternatives, land costs, and civil construction facilities of an access communication network directly correspond to those of a power network.

(Description of Real Operation of Embodiment)

FIG. 7 is a map showing an existing system and a facility deployment position alternative. This map is imported from a commercially available electronic map. Alternatively, the designer inputs required data with reference to a paper map. The designer edits data using a proper tool with a limited condition such as a road on which a cable cannot be routed. When ducts and telephone poles of telephone companies are available, they can be treated as "facility deployment position alternatives" and can be edited/input in an appending format. When a paper map is used, there are various cases to be considered. Thus, it is difficult to geographically connect two points with the shortest line.

Next, an example of designing a cable route will be described omitting an NT clustering function.

In FIG. 7, a CO (Central Office), main cable accommodated civil construction facilities, and ONUs (Optical Network Units) 1 and 2 have been distributively deployed. Cable accommodated civil construction facilities (ducts and telephone poles), one CO, and two ONUs have been designated "fixed mode" (as existing facilities) or "temporarily fixed mode" (as facilities that the designer wants to deploy at a desired position with high priority). In FIG. 7, a thick line in the design area represents that a relevant cable accommodated civil construction facility is an existing facility and designated "fixed mode". The designer will design a route of a cable in the design area. A thin line represents a line alternative routed along a road. In addition, a thin line represents a line that will be routed in future or that can be routed. In the design area of the access communication network, there are a large number of facilities. When the designer interactively designs an access communication network with the system, he or she repeatedly edits and changes data corresponding to his or her experimental rules.

For example, it is assumed that the designer selects one ONU 1 and accommodates the ONU 1 to a CO in a route at the minimum cost. At this point, facility deployment position alternatives are represented with weighted graphical notations. Branches are differently weighted depending on the regional costs and the presence of existing ducts. When the designer obtains the shortest route on the weighted graphical notations, a route with the minimum cost can be obtained.

When a cable is routed, a required duct is added and graphical notations are updated (when a duct is deployed, its weight is decreased). Thus, the cable can be bound.

FIG. 8 shows a designing stage of an active communication network. In this example, it is predicted that an existing ONU 1 and a non-existing ONU 2 are connected in a W-letter shaped route. In other words, it is difficult to connect the ONU 1 and the ONU 2 in a straight route corresponding to road information and ground water work information.

FIG. 9 shows a final designing stage of which an active communication network is deployed among a CO, an ONU 1, and an ONU 2. In other words, the designed results shown in FIG. 9 represent that the ONU 1 and the ONU 2 are connected in a V-letter shaped route as the optimized design at low construction cost. In FIG. 9, a thin line that represent another facility deployment position alternative can be used for designing another network unit.

In the above-described example, the selection order of the ONU 1 and ONU 2 is important. The selection order is optimized with a genetic algorithm. A semi-optimized solution of a cable route is calculated in a practical time period. In the above-described example, the number of ONUs is two and the facility deployment position alternatives are sparse. In reality, the number of ONUs are as many as 50 to 100 and the facility deployment position alternatives are like a web. Thus, the designing method and designing tool for designing an access communication network are effective.

The present invention has the following effects.
(a) With a repeated interactive designing operation in "temporarily fixed mode", an access communication network at low deployment cost can be calculated corresponding to information that is difficult to clearly define as limited conditions without an increase of calculation amount of an automatic designing portion.
(b) Even if "temporarily fixed mode" is added, it is not necessary to largely change the algorithm of the automatic designing portion.
(c) Since facility deployment position alternative data has land cost information per unit area at each intersection and the automatic designing portion considers the total of communication facility costs, civil construction facility costs, and land costs, an access communication network structure at low deployment cost can be accurately calculated.

In particularly, the designer can interactively design an access communication network using existing facilities with the system. Thus, since cables are bound and an RT site is shared, the total cost of the designed access communication network can be reduced.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A designing method for designing an access communication network with a computer that automatically calculates the structure of the access communication network and deployment positions of facilities thereof at low deployment costs corresponding to design parameter information including geographical information, subscription demand information, facility information, and initial accommodation ratio in a design area, the method comprising the steps of:
   (a) reading a design file and inputting the existing facility information and the various parameter information;
   (b) designating and/or canceling a fixed mode to the existing facility information and from the existing facility information;
   (c) editing and inputting a temporarily fixed mode to an additional facility that has not been designed the fixed mode;
   (d) assigning a demand to facilities that have been designated the fixed mode and the temporarily fixed mode and calculating the structure of the access communication network and the positions of facilities thereof at low deployment costs that satisfy limited conditions of the various parameter information that has been input at the step (a); and
   (e) storing the structure of the calculated access communication network and the positions of facilities thereof to the design file.

2. The designing method as set forth in claim 1, further comprising the steps of:
   (f) adding information that is insufficient in the design file and modifying information of the design file; and
   (g) editing the structure of the access communication network corresponding to the limited conditions and re-calculating the structure of facilities thereof that have been designated the temporarily fixed mode,
   wherein the step (f) is performed after the step (a), and
   wherein the step (g) is performed after the step (d).

3. The designing method as set forth in claim 1,
   wherein the existing facility information and the various parameter information at the step (a) are input from a subscription demand defining portion, a various design parameter defining portion that defines an initial accommodation ratio and a unit price of each facility, a facility parameter defining portion that defines a scale and a characteristic of each facility, a deployment position alternative defining portion that defines a facility deployment position alternative, a communication facility data defining portion that allows a communication facility to be newly input and an existing facility to be edited, and a civil construction facility data defining portion that allows a civil construction facility to be newly input and an existing facility to be edited.

4. The designing method as set forth in claim 3,
wherein at the step (a) the existing facility information and the various parameter information are input from a mode designating/canceling portion that designates "temporarily fixed mode" or "fixed mode" to an attribute of each facility and each cluster or designates another mode thereto, a cluster defining portion that allows a cluster of a trunk station and a terminal station to be newly input and an existing cluster to be edited, and a land cost defining portion that allows a land cost per unit area to be input for each intersection.

5. A designing method for designing an access communication network with a computer that automatically calculates the structure of the access communication network and deployment positions of facilities thereof at low deployment costs corresponding to design parameter information including geographical information, subscription demand information, facility information, and initial accommodation ratio in a design area, the method comprising the steps of:

(a) reading a design file and inputting the existing facility information and the various parameter information;

(b) designating and canceling a fixed mode to the existing facility information and from the existing facility information;

(c) editing and inputting a temporarily fixed mode to an additional facility that has not been designed the fixed mode;

(d) assigning a demand to facilities that have been designated the fixed mode and/or the temporarily fixed mode and calculating the structure of the access communication network and the positions of facilities thereof at low deployment costs that satisfy limited conditions of the various parameter information that has been input at the step (a);

(e) adding the cost of each facility that has been designated the temporarily fixed mode to the total cost of the existing facilities; and (f) storing the structure of the access communication network and the positions of facilities thereof obtained at the step (d) and the costs of the facilities calculated at the step (e) to the design file.

6. The designing method as set forth in claim 5,
wherein after the step (e) is performed, the steps (c), (d), and (e) are interactively and repeatedly performed.

7. A designing tool for designing an access communication network with a computer that automatically calculates the structure of the access communication network and deployment positions of facilities thereof at low deployment costs corresponding to design parameter information including geographical information, subscription demand information, facility information, and initial accommodation ratio in a design area, the method comprising:

inputting means for reading a design file and inputting the existing facility information and the various parameter information;

designating/canceling means for designating and/or canceling a fixed mode to and/or from the existing facility information;

editing/inputting means for editing and inputting a temporarily fixed mode to an additional facility that has not been designed the fixed mode;

calculating means for assigning a demand to facilities that have been designated the fixed mode and/or the temporarily fixed mode and calculating the structure of the access communication network and the positions of facilities thereof at low deployment costs that satisfy limited conditions of the various parameter information that has been input by said inputting means; and storing means for storing the structure of the calculated access communication network and the positions of facilities thereof to the design file.

8. The designing tool as set forth in claim 7, further comprising:

adding/modifying means for adding information that is insufficient in the design file and modifying information of the design file; and re-calculating means for editing the structure of the access communication network corresponding to the limited conditions and re-calculating the structure of facilities thereof that have been designated the temporarily fixed mode, wherein said adding/modifying means is performed after said inputting means, and wherein said re-calculating means is performed after said calculating means.

9. The designing tool as set forth in claim 7,
wherein said inputting means inputs the existing facility information and the various parameter information from a subscription demand defining portion, a various design parameter defining portion that defines an initial accommodation ratio and a unit price of each facility, a facility parameter defining portion that defines a scale and a characteristic of each facility, a deployment position alternative defining portion that defines a facility deployment position alternative, a communication facility data defining portion that allows a communication facility to be newly input and an existing facility to be edited, and a civil construction facility data defining portion that allows a civil construction facility to be newly input and an existing facility to be edited.

10. The designing tool as set forth in claim 9,
wherein said inputting means inputs the existing facility information and the various parameter information from a mode designating/canceling portion that designates "temporarily fixed mode" and/or "fixed mode" to an attribute of each facility and each cluster and designates another mode thereto, a cluster defining portion that allows a cluster of a trunk station and a terminal station to be newly input and an existing cluster to be edited, and a land cost defining portion that allows a land cost per unit area to be input for each intersection.

11. A record medium from which a computer reads a program that causes the computer to execute a designing method for designing an access communication network with the computer that automatically calculates the structure of the access communication network and deployment positions of facilities thereof at low deployment costs corresponding to design parameter information including geographical information, subscription demand information, facility information, and initial accommodation ratio in a design area, the method comprising the steps of:

(a) reading a design file and inputting the existing facility information and the various parameter information;

(b) designating and/or canceling a fixed mode to and/or from the existing facility information;

(c) editing and inputting a temporarily fixed mode to an additional facility that has not been designed the fixed mode;

(d) assigning a demand to facilities that have been designated the fixed mode and/or the temporarily fixed mode and calculating the structure of the access communication network and the positions of facilities thereof at low deployment costs that satisfy limited conditions of the various parameter information that has been input at the step (a); and (e) storing the structure of the calculated access communication network and the positions of facilities thereof to the design file.

12. The record medium as set forth in claim 11, wherein at the step (a) the existing facility information and the various parameter information are input from a mode designating/canceling portion that designates "temporarily fixed mode" and/or "fixed mode" to an attribute of each facility and each cluster and designates another mode thereto, a cluster defining portion that allows a cluster of a trunk station and a terminal station to be newly input and an existing cluster to be edited, and a land cost defining portion that allows a land cost per unit area to be input for each intersection.

* * * * *